US 10,288,339 B2

(12) United States Patent
Saito et al.

(10) Patent No.: US 10,288,339 B2
(45) Date of Patent: May 14, 2019

(54) GEARED MOTOR, MANUFACTURING METHOD THEREFOR AND DAMPER DEVICE

(71) Applicant: NIDEC SANKYO CORPORATION, Nagano (JP)

(72) Inventors: Shunji Saito, Nagano (JP); Takuji Fukada, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 274 days.

(21) Appl. No.: 15/307,374

(22) PCT Filed: Apr. 25, 2015

(86) PCT No.: PCT/JP2015/062621
§ 371 (c)(1),
(2) Date: Oct. 28, 2016

(87) PCT Pub. No.: WO2015/166894
PCT Pub. Date: Nov. 5, 2015

(65) Prior Publication Data
US 2017/0051964 A1    Feb. 23, 2017

(30) Foreign Application Priority Data

Apr. 30, 2014  (JP) ................................ 2014-094163
Mar. 27, 2015  (JP) ................................ 2015-065417

(51) Int. Cl.
*H02K 5/22*         (2006.01)
*H02K 15/00*        (2006.01)
(Continued)

(52) U.S. Cl.
CPC ........... *F25D 17/045* (2013.01); *F25D 17/08* (2013.01); *H02K 5/225* (2013.01); *H02K 7/116* (2013.01);
(Continued)

(58) Field of Classification Search
CPC ..... H02K 5/225; H02K 7/116; H02K 11/0094; H02K 15/0062
(Continued)

(56) References Cited

U.S. PATENT DOCUMENTS 5,737,968 A * 4/1998 Hardey .................. H02K 7/116
                                                74/421 A
7,069,803 B2 * 7/2006 Schunke ................. F16H 57/02
                                                74/421 A
(Continued)

FOREIGN PATENT DOCUMENTS

DE     29620445      1/1997
GB     2032194       4/1980
(Continued)

OTHER PUBLICATIONS

English machine translation, Toyoda, JP 2014-073007, translation on Sep. 20, 2018.*
(Continued)

*Primary Examiner* — John K Kim
(74) *Attorney, Agent, or Firm* — JCIPRNET

(57) ABSTRACT

The present invention provides a geared motor in which a motor lead can be routed within a case to a position set apart from a motor, and a damper device. In the geared motor that is used in the damper device, the case is provided with a motor lead passage that extends in the Y-direction through a position flanked, in the Z-direction, by a side plate part of a case trunk part and the rotation axis of a driving gear that is included in a gear train. It is therefore possible, with the Z-direction positions of a plurality of motor leads being defined, to extend the motor leads in the Y-direction. The Z-direction dimension of the geared motor can then be
(Continued)

reduced because the motor leads will then partially overlap the drive gear in the motor lead passage as viewed from the X-direction.

19 Claims, 8 Drawing Sheets

(51) Int. Cl.
  H02K 7/116 (2006.01)
  F25D 17/04 (2006.01)
  F25D 17/08 (2006.01)
  H02K 7/14 (2006.01)
  H02K 11/00 (2016.01)

(52) U.S. Cl.
  CPC ........... H02K 7/14 (2013.01); H02K 11/0094 (2013.01); H02K 15/0062 (2013.01)

(58) Field of Classification Search
  USPC .............................................. 310/71, 89, 99
  See application file for complete search history.

(56) References Cited

U.S. PATENT DOCUMENTS

| | | | | |
|---|---|---|---|---|
| 8,201,478 B2* | 6/2012 | Ramirez, Jr. | ......... | F16H 57/039 74/416 |
| 2002/0051349 A1 | 5/2002 | Serizawa et al. | | |
| 2007/0210666 A1 | 9/2007 | Yoshida et al. | | |
| 2013/0318695 A1* | 12/2013 | De Vito, Jr. | ........... | A47K 13/10 4/246.1 |
| 2017/0366067 A1* | 12/2017 | Hirabayashi | ........... | H02K 7/116 |

FOREIGN PATENT DOCUMENTS

| | | |
|---|---|---|
| JP | S62-018945 | 1/1987 |
| JP | 2001-317853 | 11/2001 |
| JP | 2010-159902 | 7/2010 |
| JP | 2014-073007 | 4/2014 |

OTHER PUBLICATIONS

Derwent 2014-G80999, English abstract translation, Toyoda, JP 2014-073007, translation on Sep. 20, 2018.*

English machine translation, Noritake, JP 2001-317853, translation on Sep. 20, 2018.*

"Search Report of Europe Counterpart Application", dated Dec. 5, 2017, p. 1-p. 10.

"International Search Report (Form PCT/ISA/210) of PCT/JP2015/062621", dated Jul. 28, 2015, with English translation thereof, pp. 1-2.

"Office Action of Europe Counterpart Application", dated Sep. 26, 2018, p. 1-p. 6.

* cited by examiner

Fig. 8(a)
Fig. 8(b)
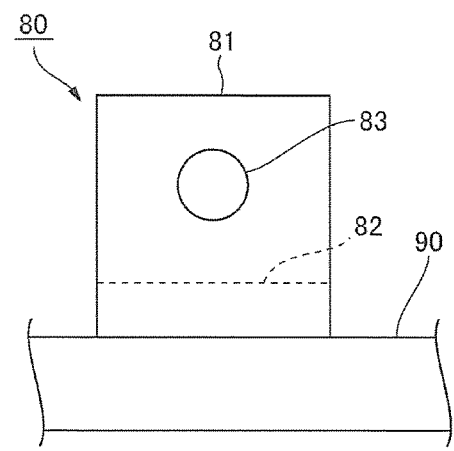
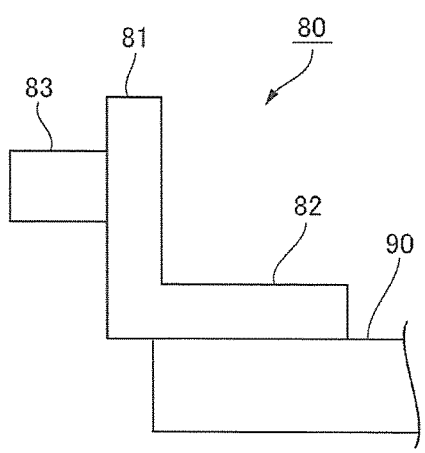
Fig. 8(c)
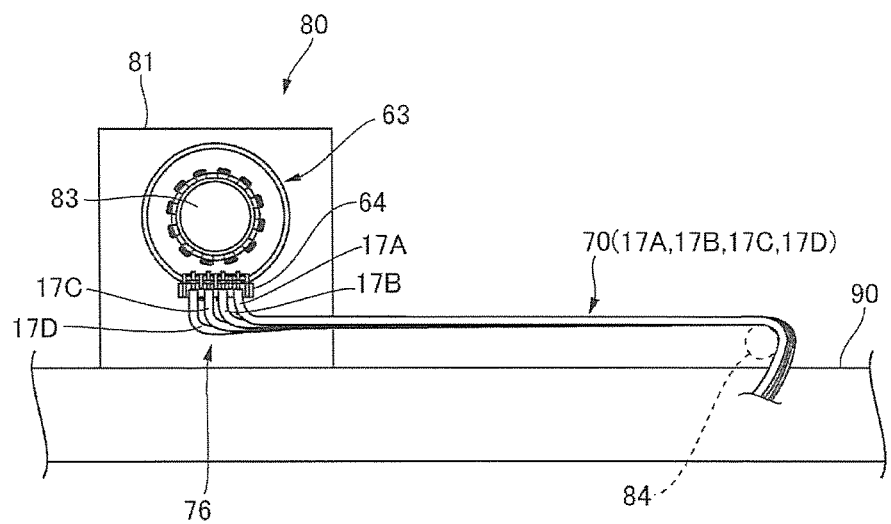

GEARED MOTOR, MANUFACTURING METHOD THEREFOR AND DAMPER DEVICE

CROSS-REFERENCE TO RELATED APPLICATION

This application is a 371 application of the international PCT application serial no. PCT/JP2015/062621, filed on Apr. 25, 2015, which claims the priority benefits of Japan application no. 2014-094163, filed on Apr. 30, 2014 and Japan application no. 2015-065417, filed on Mar. 27, 2015. The entirety of each of the above-mentioned patent applications is hereby incorporated by reference herein and made a part of this specification.

BACKGROUND OF THE INVENTION

1. Field of the Invention

The present invention relates to a geared motor including a gear train and the like inside of a case, a manufacturing method for the geared motor, and a damper device used in a cold air passage of a refrigerator or the like.

2. Description of Related Art

In a damper device which is used in a cold air passage of a refrigerator or the like, for example, a structure has been proposed that a baffle is driven by a baffle drive mechanism including a motor and a gear train to open and close an opening part formed in a frame (Patent Literature 1). In the damper device, the baffle drive mechanism is accommodated in a case to structure a geared motor. In the geared motor and the damper device, motor lead wires are arranged within the case and, in Patent Literature 1, the motor lead wires are connected with a connector near the motor.

CITATION LIST

Patent Literature

[Patent Literature 1] Japanese Patent Laid-Open No. 2010-159902

SUMMARY OF THE INVENTION

However, in the structure described in Patent Literature 1, a power feeding position to the motor is limited and thus it is inconvenient to use. On the other hand, when a connector is disposed at a position separated from the motor, the motor lead wires may be contacted with the gear train.

In view of the problem described above, an objective of the present invention is to provide a geared motor and a damper device capable of leading around motor lead wires to a position separated from a motor inside the case.

Means to Solve the Problems

To solve the above mentioned problem, the present invention provides a geared motor, wherein directions perpendicular to each other are referred to as an "X" direction and a "Y" direction, and a direction perpendicular to the "X" direction and the "Y" direction is referred to as a "Z" direction, the geared motor including a case, which is a bottomed case including a case body part which opens toward one side in the "X" direction and a bottom plate part located on the other side in the "X" direction with respect to the case body part, a cover which covers an opening of the case body part of the case on the one side in the "X" direction, a motor which is disposed inside the case, a plurality of motor lead wires having flexibility which are connected with the motor, and a gear train disposed on one side in the "Y" direction with respect to the motor in the case in a manner that turning center axial lines of gears included in the gear train are directed in the "X" direction. The case includes a motor lead wire passage whose depth direction is the "X" direction and which is extended in the "Y" direction so as to pass a position interposed in the "Z" direction between the turning center axial lines of the gears included in the gear train and the case body part, and the plurality of the motor lead wires are extended from the other side to the one side in the "Y" direction through the motor lead wire passage in a state that at least parts of the plurality of the motor lead wires are bent in the motor lead wire passage from a connecting position of the motor lead wires and the motor so as to be located on a side of the bottom plate part.

In the present invention, the case is provided with a motor lead wire passage which is extended in the "Y" direction so as to pass a position interposed in the "Z" direction between the turning center axial lines of the gears included in the gear train and the case body part. Therefore, a plurality of the motor lead wires can be extended in the "Y" direction in a state that the positions in the "Z" direction of the motor lead wires are restricted. Further, the plurality of the motor lead wires is extended in the "Y" direction through the motor lead wire passage in a state that at least parts of the motor lead wires are bent to a side of the bottom plate part from the connecting positions in the motor lead wire passage. Therefore, the motor lead wires can be led around to a position separated in the "Y" direction from the motor in a state that the motor lead wires and the gear train are not contacted with each other. Accordingly, flexibility for a power feeding position to the motor can be enhanced.

In the present invention, it may be structured that the motor lead wire passage is formed in a slit shape which opens toward the one side in the "X" direction. According to this structure, the motor lead wires can be fitted to the motor lead wire passage from the one side in the "X" direction.

In the present invention, it is preferable that parts of the plurality of the motor lead wires are overlapped with one of the gears on the other side in the "X" direction in the motor lead wire passage when viewed in the "X" direction. According to this structure, a dimension in the "Z" direction of the geared motor can be reduced.

In this case, it is preferable that the motor lead wire passage is structured by the bottom plate part on the other side in the "X" direction. According to this structure, parts of the motor lead wires can be bent to a position contacted with the bottom plate part or to a position close to the bottom plate part. Therefore, when viewed in the "X" direction, even in a case that a plurality of the motor lead wires and the gears are overlapped with each other, the motor lead wires and the gears are hard to be contacted with each other.

In the present invention, it is preferable that the motor lead wire is provided with a first portion which is extended from the connecting position, a second portion which is bent from an end part of the first portion to the other side in the "X" direction and is extended in the motor lead wire passage, a third portion which is bent from an end part on the other side in the "X" direction of the second portion to the one side in the "Y" direction and is extended in the motor lead wire passage, a fourth portion which is bent from an end part on the one side in the "Y" direction of the third portion to the one side in the "X" direction and is extended in the motor lead wire passage, and a fifth portion which is extended from an end part on the one side in the "X"

direction of the fourth portion, and at least a part of the third portion is overlapped with the one of the gears on the other side in the "X" direction when viewed in the "X" direction. According to this structure, when viewed in the "X" direction, even in a case that a plurality of the motor lead wires and the gears are overlapped with each other, the motor lead wires and the gears are hard to be contacted with each other.

In this case, it is preferable that the fifth portion is extended in the "Z" direction and held by the case. According to this structure, even if the fifth portion is pulled, the third portion is hard to be floated to the one side in the "X" direction. Therefore, when viewed in the "X" direction, even in a case that a plurality of the motor lead wires and the gears are overlapped with each other, the motor lead wires and the gears are hard to be contacted with each other.

In the present invention, it is preferable that the cover is provided with a cover side projection at a position displaced from the gears in the "Y" direction so as to protrude toward the other side in the "X" direction to prevent displacement of the third portion to the one side in the "X" direction. According to this structure, displacement to the one side in the "X" direction of the third portion can be prevented and thus, when viewed in the "X" direction, even in a case that the third portion and a gears are overlapped with each other, the motor lead wires and the gears are hard to be contacted with each other.

In the present invention, it is preferable that the plurality of the motor lead wires is juxtaposed in the "X" direction and extended in the "Y" direction in the motor lead wire passage. According to this structure, a region occupied by the plurality of the motor lead wires is narrow in the "Z" direction and thus even when the plurality of the motor lead wires are disposed at a position near the turning center axial lines of the gears, the motor lead wires and the gears are hard to be contacted with each other.

In the present invention, it is preferable that the case is provided with a lead wire receiving part which is obliquely inclined from the "X" direction to the "Z" direction in the motor lead wire passage, and the third portions of the plurality of the motor lead wires are juxtaposed in the "X" direction in an obliquely inclined state in the "Z" direction along the lead wire receiving part. According to this structure, a region occupied in the "X" direction by the plurality of the motor lead wires is narrow and thus, even when the third portions and the gears are overlapped with each other when viewed in the "X" direction, the motor lead wires and the gears are hard to be contacted with each other.

In the present invention, it is preferable that the plurality of the motor lead wires are formed in a flat cable in which the plurality of the motor lead wires are connected with each other in a juxtaposed state in the "X" direction in the motor lead wire passage. According to this structure, a plurality of the motor lead wires is easily accommodated in the motor lead wire passage.

In the present invention, it is preferable that lengths of part or all of the plurality of the motor lead wires are different from each other, the motor includes a plurality of terminals whose distances from an outlet of the motor lead wire passage are different from each other, and part or all of the plurality of the terminals are connected with the motor lead wires having shorter lengths as located nearer to the outlet of the motor lead wire passage. According to this structure, the terminal farther from the outlet of the motor lead wire passage is connected with a motor lead wire having a longer length. Therefore, a motor lead wire having a needlessly long length is prevented from being connected with a terminal which is near to the outlet of the motor lead wire passage and thus slack of the lead wire does not become excessively large. Further, a shorter motor lead wire can be avoided from being connected with a terminal which is far from the outlet of the motor lead wire passage and thus the motor lead wire is avoided from being pulled. Therefore, the motor lead wires can be easily led around from the motor lead wire passage to the terminals.

In the present invention, it is preferable that, in the motor lead wire passage, the plurality of the motor lead wires is located in the motor lead wire passage closer to the one side in the "X" direction as the terminal connected with the motor lead wire is nearer to the outlet of the motor lead wire passage. According to this structure, the nearer to the outlet of the motor lead wire passage a terminal is, a motor lead wire overlapped on an upper side in the motor lead wire passage is connected with the nearer terminal. Therefore, a plurality of the motor lead wires can be led around orderly.

The present invention is effectively applied to a case that the case body part is formed in a rectangular shape whose long side is extended in the "Y" direction when viewed in the "X" direction.

In the present invention, it is preferable that the motor is held by the case and the gear train is turnably supported by the bottom plate part of the case. According to this structure, it is sufficient to fit the cover after the motor and the gear train are assembled in the case and thus assembling work is easily performed.

The present invention provides a manufacturing method for the above-mentioned geared motor including a bending tendency giving process in which the plurality of the motor lead wires are given with a bending tendency in a bent shape, and a assembling process in which the plurality of the motor lead wires which have been given with the bending tendency is assembled in the case. According to this structure, when the motor lead wires are to be assembled in the case, bending work is not required to perform at the spot. Therefore, work for assembling the motor lead wires is easily performed and a working hour can be shortened.

The geared motor to which the present invention is applied can be used in a damper device. The damper device includes a frame which is provided on the one side in the "X" direction with respect to the case and is formed with an opening part opening in the "Z" direction, and a baffle configured to open and close the opening part, and the baffle is driven by the geared motor.

In the present invention, it is preferable that the cover is integrally structured with the frame. According to this structure, in comparison with a case that the cover and the frame are separately structured from each other, assembling efficiency is improved and the number of components can be reduced.

In the present invention, it is preferable that the damper device includes a heater which is fixed to the frame around the opening part and a heater lead wire having flexibility which is electrically connected with the heater. The heater lead wire is extended to the other side in the "X" direction of the cover through a heater lead wire passage formed in the cover and is led out from the case to an outer side together with the plurality of the motor lead wires, and at least one of the cover and the case is provided with a lead wire support part which supports a midway portion of the heater lead wire from an outer side. According to this structure, the heater lead wire is held at the time of assembling of the damper device. Therefore, troublesome labor is not required for fixing the heater lead wire.

In this case, it is preferable that the cover is provided with a cover side lead wire support part as the lead wire support part which supports midway portions of the plurality of the motor lead wires and the heater lead wire from the outer side between an outer face of the case and the cover side lead wire support part.

Effects of the Invention

In the present invention, the case is provided with a motor lead wire passage which is extended in the "Y" direction so as to pass a position interposed in the "Z" direction between a turning center axial lines of gears included in a gear train and the case body part. Therefore, a plurality of the motor lead wires can be extended in the "Y" direction in a state that the positions in the "Z" direction of the motor lead wires are restricted. Further, the plurality of the motor lead wires is extended in the "Y" direction through the motor lead wire passage in a state that at least parts of the motor lead wires are bent to a side of the bottom plate part with respect to the connecting positions with the motor in the motor lead wire passage. Therefore, the motor lead wires can be led around to a position separated in the "Y" direction from the motor in a state that the motor lead wires and the gear train are not contacted with each other. Accordingly, flexibility for a power feeding position to the motor can be enhanced.

BRIEF DESCRIPTION OF THE DRAWINGS

FIGS. 8(a), 8(b) and 8(c) are explanatory views showing a jig for performing connecting work of motor lead wires and a motor.

DESCRIPTION OF EMBODIMENTS

A damper device for a refrigerator to which the present invention is applied will be described below with reference to the accompanying drawings. In the following descriptions, a turning center axial line of a baffle 4 is indicated by the "L", a direction along the turning center axial line "L" is referred to as the "X" direction, a direction that an opening part 210 faces is referred to as the "Z" direction, and a direction perpendicular to the "X" direction and the "Z" direction is referred to as the "Y" direction. Further, the "X1" is one side in the "X" direction, the "X2" is the other side in the "X" direction, the "Y1" is one side in the "Y" direction, the "Y2" is the other side in the "Y" direction, the "Z1" is one side in the "Z" direction, and the "Z2" is the other side in the "Z" direction.

(Entire Structure)

Figure 1A:
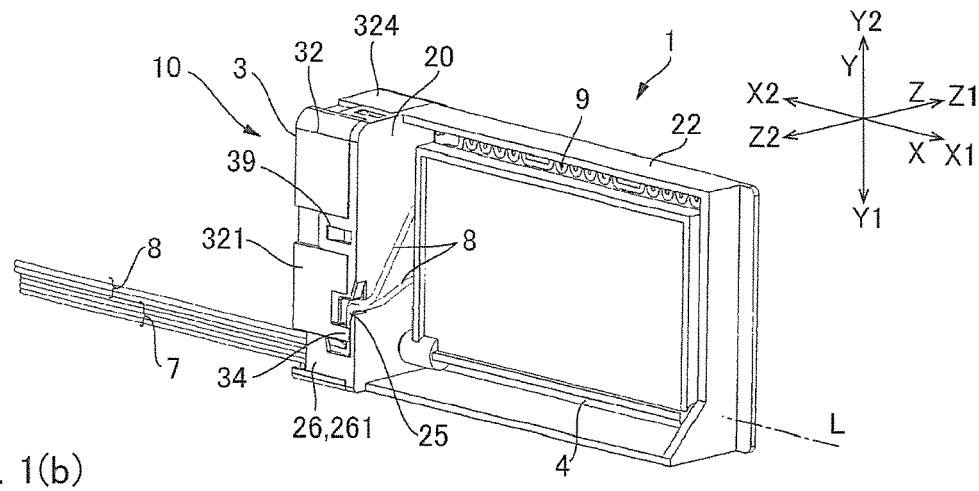
FIGS. 1(a), 1(b) and 1(c) are perspective views showing a damper device to which the present invention is applied and which is viewed from a side where a baffle is disposed.
Figure 1B:
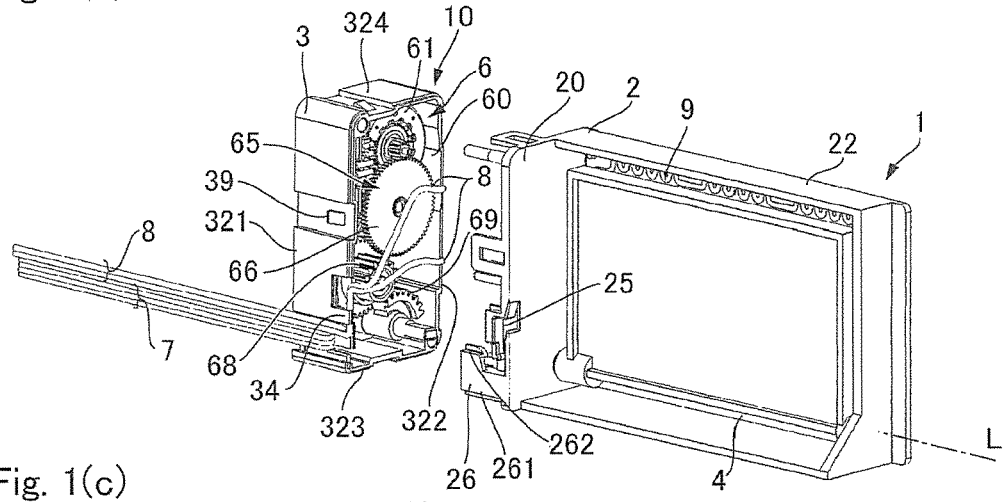
Figure 1C:
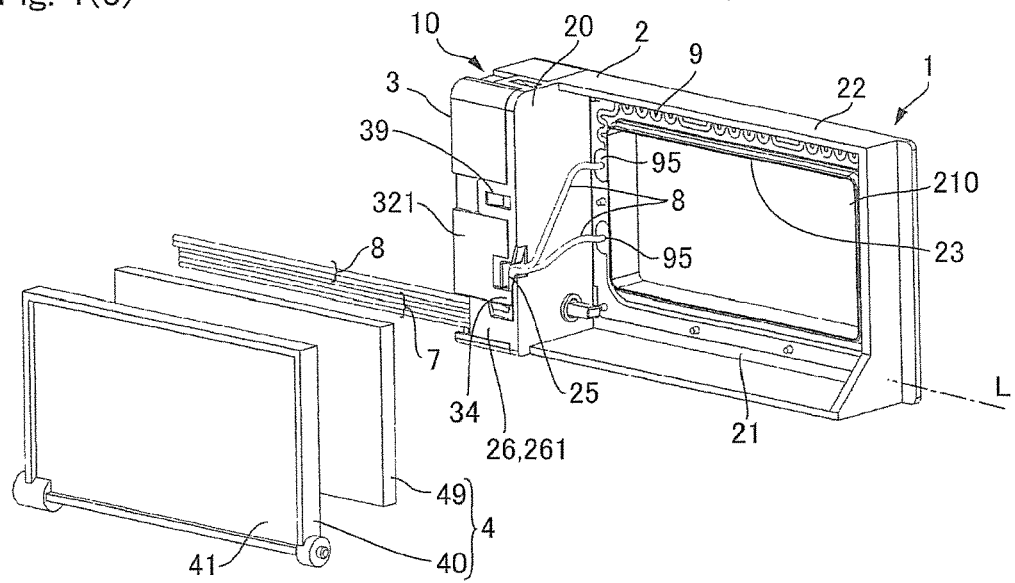
Figure 2A:
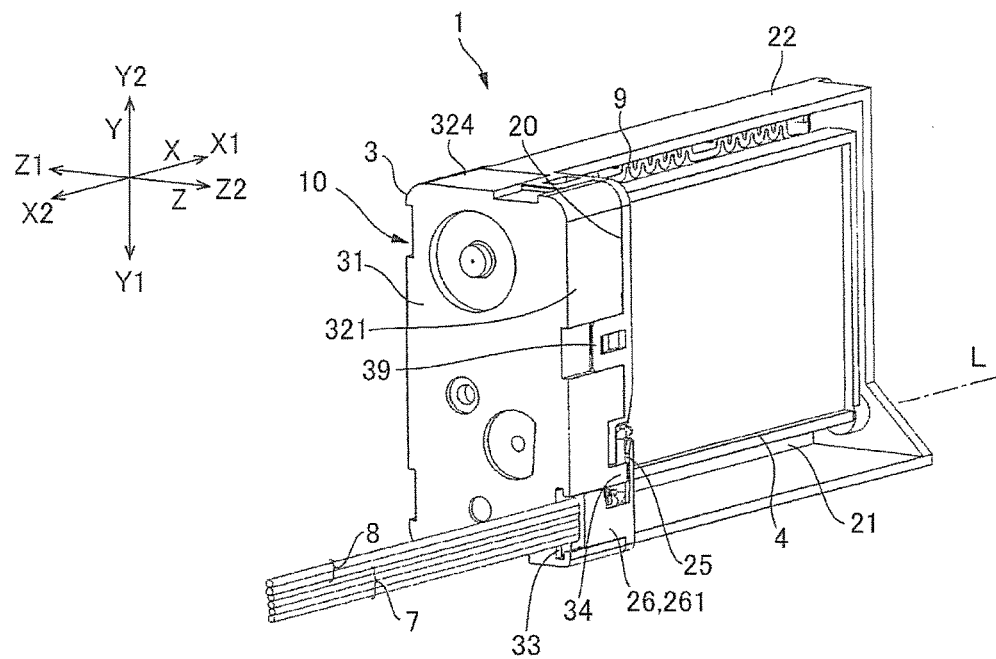
FIGS. 2(a) and 2(b) are perspective views showing a damper device to which the present invention is applied and which is viewed from an opposite side to a side where a baffle is disposed.
Figure 2B:
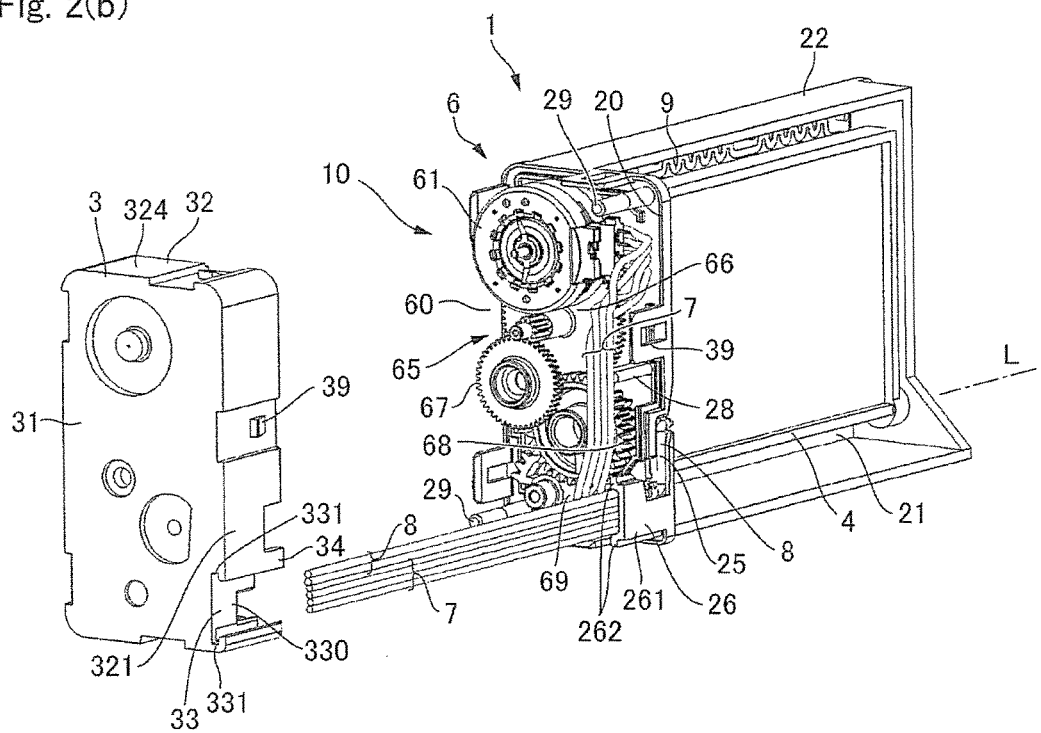

FIGS. 1(a), 1(b) and 1(c) are perspective views showing a damper device 1 to which the present invention is applied and which is viewed from a side where a baffle 4 is disposed. FIG. 1(a) is a perspective view showing an entire damper device 1, FIG. 1(b) is an exploded perspective view showing the damper device 1 which is disassembled into a frame 2 and a case 3, and FIG. 1(c) is an exploded perspective view showing the damper device 1 in which a baffle 4 is detached. FIGS. 2(a) and 2(b) are perspective views showing the damper device 1 to which the present invention is applied and which is viewed from an opposite side to a side where the baffle 4 is disposed. FIG. 2(a) is a perspective view showing the entire damper device 1 and FIG. 2(b) is an exploded perspective view showing the damper device 1 which is disassembled into the frame 2 and the case 3. FIGS. 1(a), 1(b) and 1(c) and FIGS. 2(a) and 2(b) show a state that the baffle 4 closes an opening part 210. Further, in FIG. 1(b), heater lead wires 8 are shown so as to be held on a side of the case 3 for convenience but, when the case 3 is to be connected with a cover 20, the heater lead wires 8 are held on the side of the cover 20.

As shown in FIGS. 1(a), 1(b) and 1(c) and FIGS. 2(a) and 2(b), the damper device 1 in this embodiment includes a flame 2 formed with a rectangular opening part 210 which opens in the "Z" direction, a baffle 4 for opening and closing the opening part 210 of the frame 2, a baffle drive mechanism 6 which is disposed in a drive chamber 60 adjacent to the opening part 210 and the baffle 4 through a cover 20 on the other side "X2" in the "X" direction, and a case 3 which is fitted to the cover 20 from the other side "X2" in the "X" direction to section the drive chamber 60 between the cover 20 and the case 3. In this embodiment, the cover 20 and the case 3 are connected by a hook mechanism 39. In this state, the case 3, the cover 20 and the baffle drive mechanism 6 structure a geared motor 10. The cover 20 is formed with shaft parts 29 protruded to the other side "X2" in the "X" direction to position the case 3 with respect to the cover 20 and a cover side projection 28 which presses motor lead wires 7 described below. In this embodiment, the frame 2, the cover 20 and the case 3 are made of resin.

The frame 2 is provided with a rectangular end plate part 21 in which the opening part 210 is formed, and a body part 22 in a rectangular tube shape which is protruded to the other side "Z2" in the "Z" direction from an outer side edge of the end plate part 21. In this embodiment, the cover 20 is structured as a portion of the body part 22 located on the other side "X2" in the "X" direction and is integrally formed with the frame 2.

A seal plate part 23 in a rectangular tube shape which is protruded toward a side where the baffle 4 is located is formed at an edge of the opening part 210 in the end plate part 21. The baffle 4 is abutted with the seal plate part 23 to set the opening part 210 in a closed state. The baffle 4 includes an opening/closing plate 40 provided with a flat plate part 41 whose size is larger than the opening part 210, and a sheet-shaped elastic member 49 made of foamed polyurethane or the like which is stuck on a face of the opening/closing plate 40 on a side of the opening part 210. The elastic member 49 is abutted with a portion surrounding the opening part 210 (seal plate part 23) to close the opening part 210.

The baffle 4 is supported by the frame 2 so as to be turnable around the turning center axial line "L" extended in the "X" direction and the baffle drive mechanism 6 turns the baffle 4 around the turning center axial line "L" to open and close the opening part 210.

In this embodiment, a face of the end plate part 21 of the frame 2 on a side where the baffle 4 is located is attached with a heater 9 so as to surround the opening part 210 (surround the seal plate part 23). In this embodiment, the heater 9 is formed in a sheet shape.

The damper device 1 is disposed on an inner side of a duct which structures a cold air passage. In this embodiment, cold air flows through the opening part 210 from an opposite side to a side where the baffle 4 is disposed with respect to the opening part 210. Alternatively, cold air may flow through the opening part 210 from a side where the baffle 4 is disposed with respect to the opening part 210.

(Structure of Baffle Drive Mechanism 6)

In the damper device 1 and the geared motor 10 in this embodiment, the baffle drive mechanism 6 includes a motor 61 disposed on an inner side of the case 3 and a gear train 65 structured to transmit rotation of the motor 61 to the baffle 4 on one side "Y1" in the "Y" direction with respect to the motor 61. In this embodiment, the motor 61 is a stepping motor. The case 3 is a bottomed case which is provided with a bottom plate part 31 located on the other side "X2" in the "X" direction and a rectangular tube shaped case body part 32 protruded to a side of the cover 20 (one side "X1" in the "X" direction) from the bottom plate part 31. The case body part 32 is opened toward the one side "X1" in the "X" direction. The case body part 32 is provided with side plate parts 321 and 322 facing in the "Z" direction and side plate parts 323 and 324 facing in the "Y" direction. The bottom plate part 31 and the case body part 32 are, when viewed in the "X" direction, formed in a quadrangular shape whose long sides are extended in the "Y" direction and short sides are extended in the "Z" direction. The motor 61 is held between the frame 2 and the cover 20 by the case 3.

The gear train 65 includes a first gear 66 having a large diameter gear engaged with a motor pinion, a second gear 67 having a large diameter gear engaged with a small diameter gear of the first gear 66, and a drive gear 68 having a large diameter gear engaged with a small diameter gear of the second gear 67. Therefore, in the gear train 65, the first gear 66, the second gear 67 and the drive gear 68 structure a reduction gear train. Further, the gear train 65 includes a sector gear 69 which is engaged with the drive gear 68 and is driven by the drive gear 68. The sector gear 69 is a final gear (output gear) located at the last stage of the gear train 65 and is connected with the baffle 4. In this embodiment, all the gears of the gear train 65 (first gear 66, second gear 67, drive gear 68 and sector gear 69) are turnably supported by the bottom plate part 31 of the case 3 with their turning center axial lines directing in the "X" direction.

In the damper device 1 structured as described above, the motor 61 is connected with totaled four (4) motor lead wires 7. The motor lead wires 7 are, inside the drive chamber 60, led around from a connecting position 79 with the motor 61 to one side "Y1" in the "Y" direction through the other side "Z2" in the "Z" direction and then extended toward the other side "X2" in the "X" direction and led out to the outside of the case 3.

Further, in the damper device 1, the heater 9 is connected with totaled two (2) heater lead wires 8. The heater lead wires 8 are connected with the heater 9 on one side "X1" in the "X" direction (side where the heater 9 is disposed) with respect to the cover 20 and then led around to the other side "X2" in the "X" direction with respect to the cover 20 through a heater lead wire passage 25 formed in the cover 20, and then extended toward the other side "X2" in the "X" direction and led out to the outside of the case 3. The heater lead wires 8 are extended toward the other side "X2" in the "X" direction juxtaposed with the motor lead wires 7 and led out to the outside of the case 3. In this embodiment, the heater lead wire passage 25 is formed in an outer peripheral side edge part of the cover 20.

(Fixing Structure of Motor Lead Wires 7 and Heater Lead Wires 8 and the Like)

In order to extend the heater lead wires 8 toward the other side "X2" in the "X" direction and lead out to the outside of the case 3, at least one of the cover 20 and the case 3 is formed with a lead wire support part for supporting midway portions of the heater lead wires 8 from an outer face side. In this embodiment, the cover 20 is structured with a cover side lead wire support part 26 which supports midway portions of the heater lead wires 8 from an outer face side between an outer face of the case body part 32 of the case 3 and the cover side lead wire support part 26. More specifically, the heater lead wires 8 are extended in the "X" direction along the side plate part 321 of the case 3, and the cover side lead wire support part 26 covers the heater lead wires 8 from the other side "Z2" (outer face side) in the "Z" direction and supports the midway portions of the heater lead wires 8 between the side plate part 321 of the case 3 and the cover side lead wire support part 26. In this embodiment, also in a case that the motor lead wires 7 are to be extended toward the other side "X2" in the "X" direction and led out to the outside of the case 3, the cover side lead wire support part 26 supports midway portions of the motor lead wires 7 between the outer face of the case body part 32 of the case 3 and the cover side lead wire support part 26. More specifically, the motor lead wires 7 are extended in the "X" direction along the side plate part 321 of the case 3, and the cover side lead wire support part 26 covers the motor lead wires 7 from the other side "Z2" (outer face side) in the "Z" direction and supports the midway portions of the motor lead wires 7 between the side plate part 321 and the cover side lead wire support part 26. Therefore, at the time of assembling of the damper device 1, portions of the motor lead wires 7 and the heater lead wires 8 extended to the other side "X2" in the "X" direction are fixed by the case 3 and the cover 20. Therefore, much troublesome labor is not required for fixing portions of the motor lead wires 7 and the heater lead wires 8 extended to the other side "X2" in the "X" direction.

In this embodiment, a portion of the side plate part 321 overlapped with the motor lead wires 7 and the heater lead wires 8 is formed in a recessed part 33 which is recessed to a side of the drive chamber 60 and the cover side lead wire support part 26 is formed in a plate shape. Therefore, when the case 3 is to be fitted to the cover 20 from the other side "X2" in the "X" direction, the cover side lead wire support part 26 is inserted to the recessed part 33 from one side "X1" in the "X" direction and the motor lead wires 7 and the heater lead wires 8 are supported between the bottom part 330 of the recessed part 33 and the cover side lead wire support part 26.

The cover side lead wire support part 26 is provided with a flat plate part 261, which covers the motor lead wires 7 and the heater lead wires 8 on the other side "Z2" in the "Z" direction, and protruded plate parts 262 protruded to one side "Z1" in the "Z" direction from both ends in the "Y" direction of the flat plate part 261. Respective tip ends of the two protruded plate parts 262 are bent toward opposite sides to each other. On the other hand, the recessed part 33 of the case 3 are formed with groove-shaped engaging parts 331 extended in the "X" direction at both ends in the "Y" direction of the bottom part 330. Therefore, when the cover side lead wire support part 26 is inserted to the recessed part 33, respective tip ends of two protruded plate parts 262 are fitted to the groove-shaped engaging parts 331 formed in the recessed part 33 of the case 3. As a result, the cover side lead wire support part 26 is positioned in the "Y" direction and the "Z" direction. Therefore, the position of the cover side lead wire support part 26 is determined surely and thus, the motor lead wires 7 and the heater lead wires 8 can be surely fixed.

In this state, a distance between the side plate part 321 and the cover side lead wire support part 26 (distance between the bottom part 330 of the recessed part 33 and the flat plate part 261) is larger than a diameter of the motor lead wire 7 and a diameter of the heater lead wire 8. Therefore, in a state shown in FIG. 2(b), when the cover 20 and the case 3 are to be connected with each other, the motor lead wires 7 and the heater lead wires 8 are not scratched. Accordingly, the cover 20 and the case 3 can be easily connected with each other and insulation coating layers of the motor lead wire 7 and the heater lead wire 8 are hard to be damaged.

Further, in this embodiment, the side plate part 321 of the case 3 is formed with a case side lead wire support part 34 which covers the heater lead wire passage 25 from the other side "Z2" in the "Z" direction and supports midway portions of the motor lead wires 7 from the other side "Z2" (outer face side) in the "Z" direction.

The heater lead wire passage 25 is provided with a first passage which opens toward one side "X1" in the "X" direction, a second passage which is bent from an end part of the first passage on the other side "X2" in the "X" direction to the other side "Y2" in the "Y" direction, and a third passage which is bent from an end part of the second passage on an opposite side to a side of the first passage to the other side "X2" in the "X" direction. The cover side lead wire support part 26 is provided in the third passage. Therefore, after the heater lead wires 8 are pushed to the heater lead wire passage 25 from the other side "Z2" in the "Z" direction, when the heater lead wires 8 are fitted to one side "Z1" in the "Z" direction of the cover side lead wire support part 26 from one side "Y1" in the "Y" direction, the heater lead wires 8 are held by the cover 20. In this state, even when the heater lead wires 8 are pulled to the other side "X2" in the "X" direction, the pulling force is received by the bent portion of the heater lead wire passage 25. Therefore, the force is hard to reach to the connecting position 95 of the heater lead wires 8 with the heater 9 and thus connection of the heater lead wires 8 and the heater 9 is hard to be disengaged.

(Leading-Around Structure of Motor Lead Wire 7)

Figure 3A:
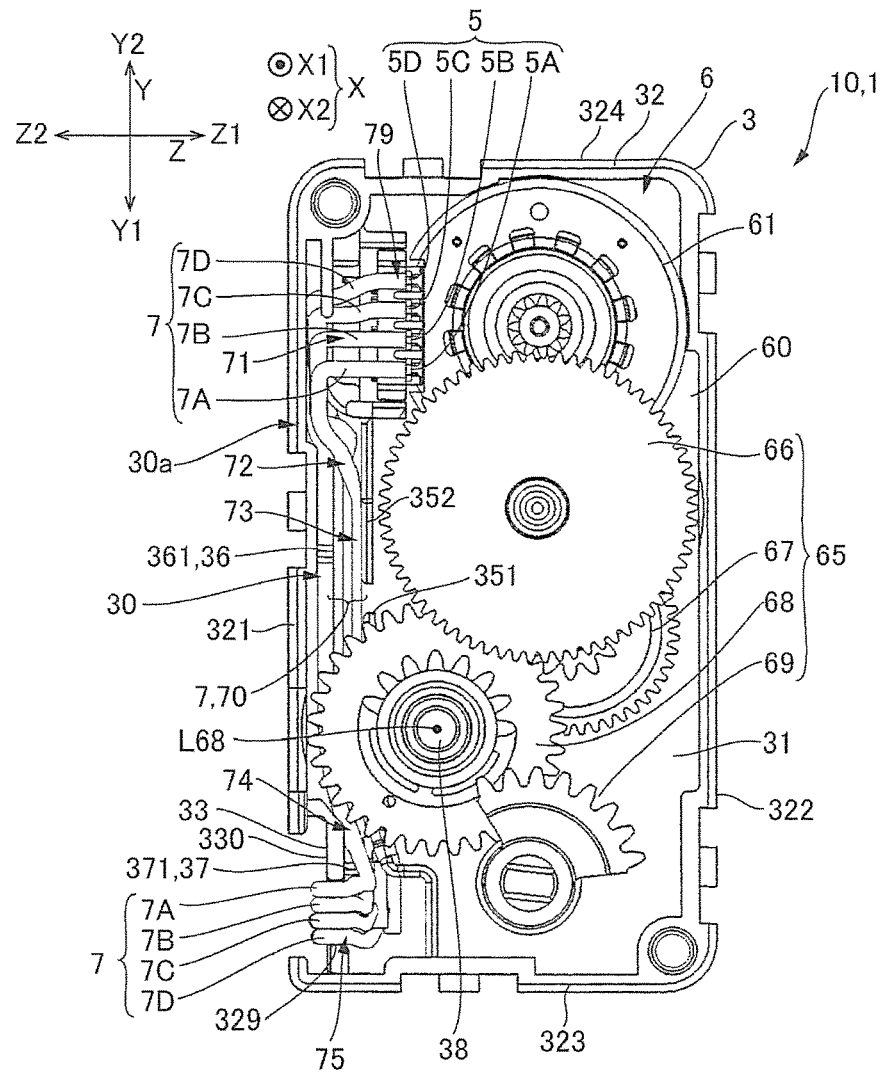
FIGS. 3(a), 3(b) and 3(c) are explanatory views showing a leading-around structure of motor lead wires in a geared motor and a damper device to which the present invention is applied.
Figure 3B:
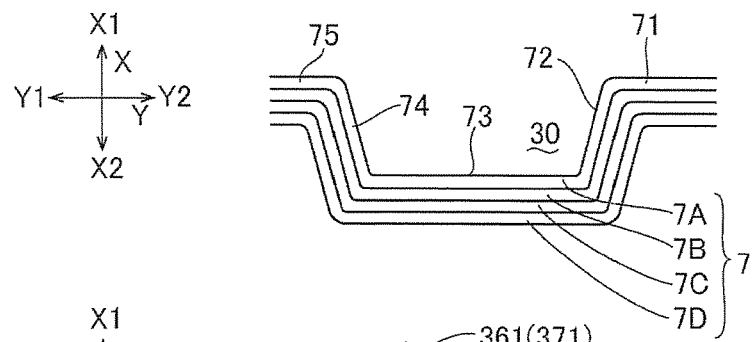
Figure 3C:
Figure 4A:
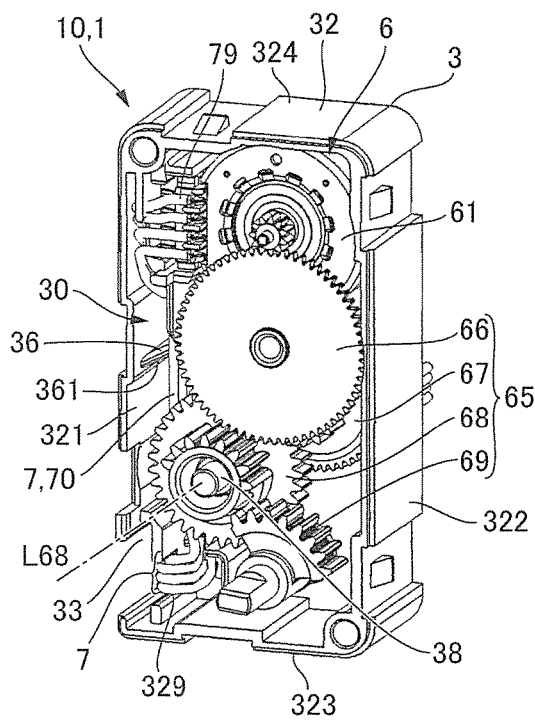
FIGS. 4(a), 4(b) and 4(c) are explanatory views showing an inside of a case in a geared motor and a damper device to which the present invention is applied.
Figure 4A:
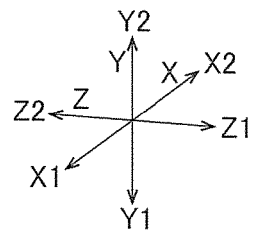
Figure 4B:
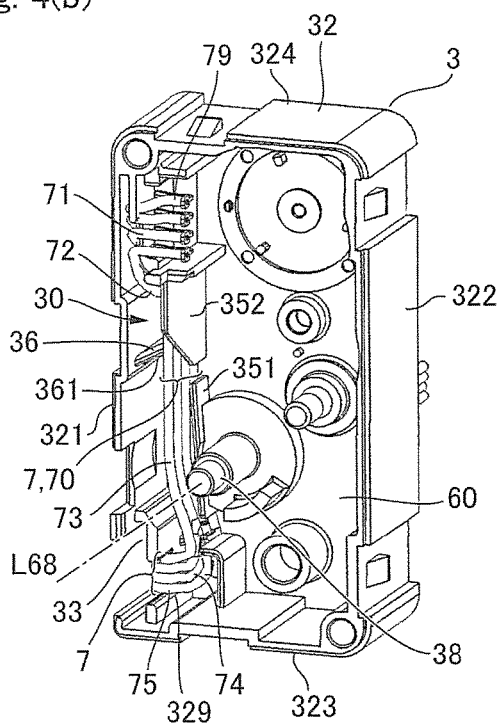
Figure 4C:
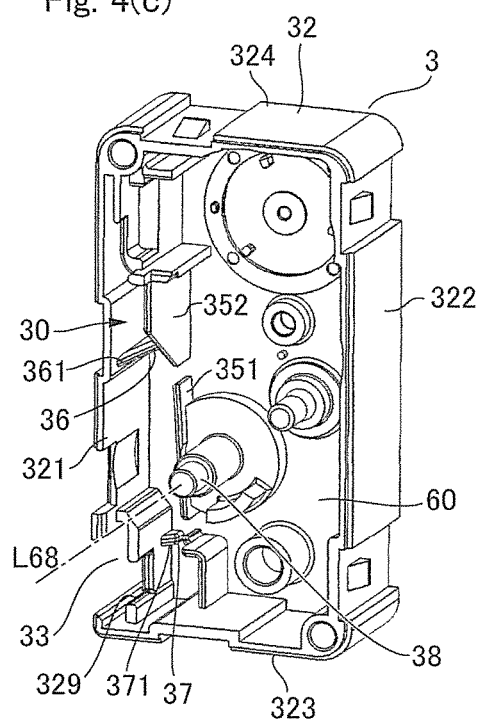
Figure 5:
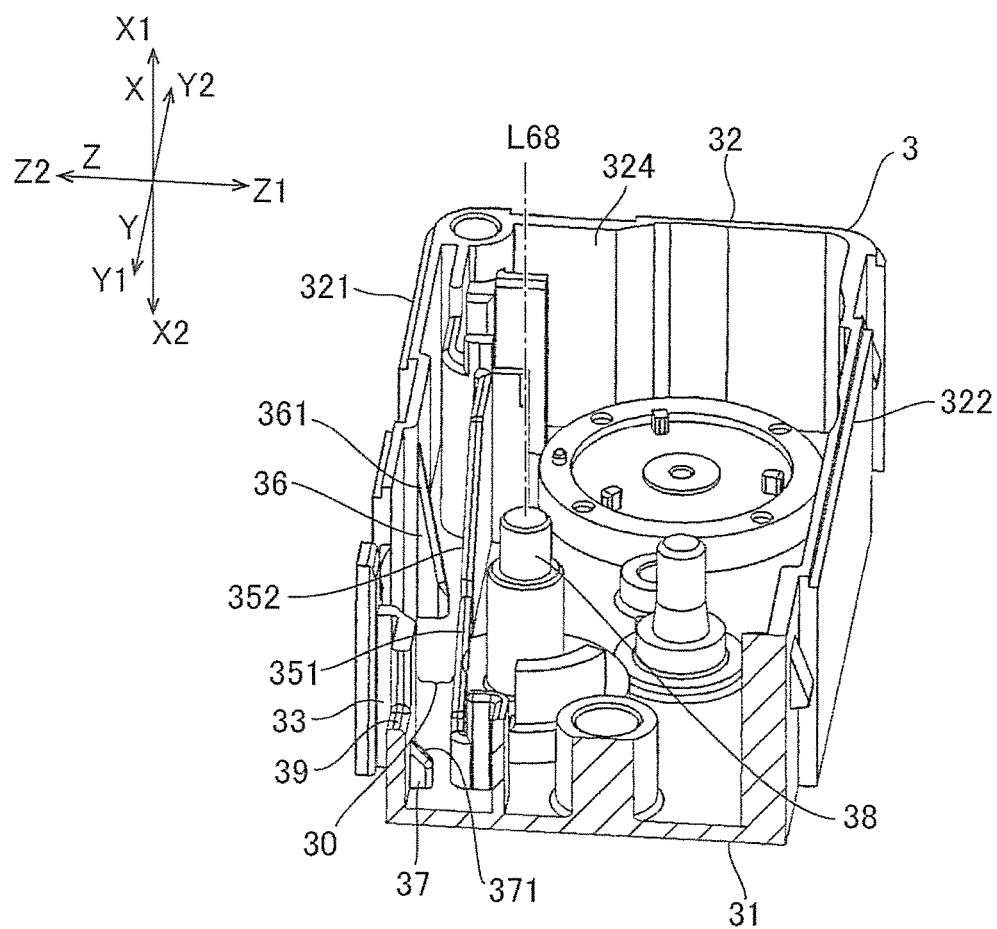
FIG. 5 is an explanatory view showing a motor lead wire passage which is formed in a case in a geared motor and a damper device to which the present invention is applied.

FIGS. 3(a), 3(b) and 3(c) are explanatory views showing a leading-around structure of motor lead wires 7 in the geared motor 10 and the damper device 1 to which the present invention is applied. FIG. 3(a) is a plan view showing an inside of the case 3 viewed from one side "X1" in the "X" direction, FIG. 3(b) is an explanatory view showing a bent structure of the motor lead wires 7 viewed in the "Z" direction, and FIG. 3(c) is an explanatory view showing a juxtaposed state of the motor lead wires 7 viewed in the "Y" direction. FIGS. 4(a), 4(b) and 4(c) are explanatory views showing an inside of the case 3 in the geared motor 10 and the damper device 1 to which the present invention is applied. FIG. 4(a) is a perspective view showing an inside of the case 3, FIG. 4(b) is a perspective view showing a state that the gear train 65 and the like are detached, an FIG. 4(c) is an explanatory view showing a state that the motor lead wires 7 are further detached. FIG. 5 is an explanatory view showing a motor lead wire passage 30 which is formed in the case 3 in the geared motor 10 and the damper device 1 to which the present invention is applied. In FIGS. 3(a), 3(b) and 3(c) and FIGS. 4(a), 4(b) and 4(c), the heater lead wires 8 are not shown.

As shown in FIGS. 3(a), 3(b) and 3(c), FIGS. 4(a), 4(b) and 4(c) and FIG. 5, in the geared motor 10 and the damper device 1 in this embodiment, the case 3 is provided with a motor lead wire passage 30 which is extended in the "Y" direction so as to pass a position interposed in the "Z" direction between a turning center axial line of a gear included in the gear train 65 and the case body part 32. A plurality of the motor lead wires 7 is extended from the other side "Y2" to one side "Y1" in the "Y" direction passing through the motor lead wire passage 30. In this embodiment, a depth direction of the motor lead wire passage 30 is the "X" direction, and the other side "X2" in the "X" direction of the motor lead wire passage 30 is structured of the bottom plate part 31. Therefore, the motor lead wire passage 30 is reached to the bottom plate part 31 on the other side "X2" in the "X" direction.

In this embodiment, the case 3 is provided with the motor lead wire passage 30 at a position interposed in the "Z" direction between a turning center axial line "L68" of the drive gear 68 included in the gear train 65 and the side plate part 321 located on the other side "Z2" in the "Z" direction of the case body part 32. More specifically, the bottom plate part 31 of the case 3 is formed with a support shaft 38 which turnably supports the drive gear 68 and a first plate-shaped projection 351 whose plate thickness direction is the "Z" direction is formed between the support shaft 38 and the side plate part 321. The first plate-shaped projection 351 is extended in the "Y" direction so as to face the side plate part 321 in the "Z" direction. Therefore, the motor lead wire passage 30 in a slit shape which opens toward the "X" direction is formed between the first plate-shaped projection 351 and the side plate part 321. Further, in this embodiment, the bottom plate part 31 of the case 3 is also formed with a second plate-shaped projection 352 whose plate thickness direction is the "Z" direction at a position separated from the first plate-shaped projection 351 on the other side "Y2" in the "Y" direction. The second plate-shaped projection 352 is, similarly to the first plate-shaped projection 351, extended in the "Y" direction so as to face the side plate part 321 in the "Z" direction. Therefore, in this embodiment, the motor lead wire passage 30 in a slit shape which opens toward the "X" direction is formed between the first plate-shaped projection 351 and the side plate part 321 and between the second plate-shaped projection 352 and the side plate part 321.

Therefore, a plurality of the motor lead wires 7 is extended from the other side "Y2" in the "Y" direction to one side "Y1" passing the motor lead wire passage 30 and, in this state, a part of the plurality of the motor lead wires 7 is overlapped with the drive gear 68 on the other side "X2" in the "X" direction part in the motor lead wire passage 30 when viewed in the "X" direction.

Therefore, in this embodiment, as shown in FIG. 3(b) and FIG. 4(b), a plurality of the motor lead wires 7 is bent in the motor lead wire passage 30 so that at least a part of the motor lead wires 7 is located on a side of the bottom plate part 31 with respect to their connecting positions 79 with the motor 61 and is passed through the motor lead wire passage 30 and extended to one side "Y1" from the other side "Y2" in the "Y" direction.

More specifically, each of a plurality of the motor lead wires 7 is provided with a first portion 71 extended from the connecting position 79 with the motor 61, a second portion 72 which is bent to the other side "X2" in the "X" direction from an end part of the first portion 71 and extended in the motor lead wire passage 30, and a third portion 73 which is bent to one side "Y1" in the "Y" direction from an end part on the other side "X2" in the "X" direction of the second portion 72 and is extended in the motor lead wire passage 30. Further, each of a plurality of the motor lead wires 7 is provided with a fourth portion 74 which is bent from an end part on one side "Y1" in the "Y" direction of the third portion 73 to one side "X1" in the "X" direction and is extended in the motor lead wire passage 30 and a fifth portion 75 which is extended from an end part on one side "X1" in the "X" direction of the fourth portion 74. Therefore, in each of a plurality of the motor lead wires 7, at least a part of the third portion 73 is overlapped with the drive gear 68 in the "X" direction when viewed in the "X" direction. This state is maintained by firmness (shape retaining force) of the motor lead wire 7 itself. Further, bent portions in the "X" direction are existed on both sides of the third portion 73. Therefore, the third portion 73 is hard to be floated to one side "X1" in the "X" direction.

The first portion 71 is extended to the other side "Z2" in the "Z" direction from the connecting position 79 with the motor 61. Further, the fifth portion 75 is extended to the other side "Z2" in the "Z" direction from the fourth portion 74 and further extended to the other side "X2" in the "X" direction. In this embodiment, the fifth portion 75 is passed through a cut-out part 329 formed in the side plate part 321 of the case 3 and a tip end side of the fifth portion 75 is further extended to the other side "X2" in the "X" direction in a state that the fifth portion 75 is grasped and held from both sides in the "Y" direction by the side plate part 321 of the case 3. Therefore, even when the fifth portion 75 is pulled to the other side "X2" in the "X" direction, the third portion 73 is hard to be floated to one side "X1" in the "X" direction. Accordingly, even in a case that a plurality of the motor lead wires 7 and the drive gear 68 are overlapped with each other when viewed having looked from "X" direction, the motor lead wires 7 and the drive gear 68 are hard to be contacted with each other.

Further, the cover side projection 28 shown in FIG. 2(b) is protruded from the cover 20 toward the other side "X2" in the "X" direction at a position displaced to the other side "Y2" in the "Y" direction with respect to the drive gear 68, and prevents the third portion 73 of the motor lead wire 7 from displacing to one side "X1" in the "X" direction.

In this embodiment, a plurality of the motor lead wires 7 is extended in the "Y" direction in the motor lead wire passage 30 so that they are arranged in parallel or juxtaposed in the "X" direction and, in this state, a plurality of the motor lead wires 7 is structured of the second portion 72, the third portion 73, the fourth portion 74 and the like which are bent at plural positions. In order to attain this structure, in this embodiment, a plurality of motor lead wires 7 is structured of a flat cable 70 in which a plurality of motor lead wires 7 are connected with each other in a juxtaposed state in a row. A part in a length direction of the flat cable 70 is separated into a plurality of the motor lead wires 7 and connected with the motor 61. Also in this case, at least a portion accommodated in the motor lead wire passage 30 is in a state of the flat cable 70 and a thickness direction of the flat cable 70 is the "Z" direction. Therefore, the third portion 73 of a plurality of the motor lead wires 7 is easily accommodated in the motor lead wire passage 30.

In this embodiment, the third portions 73 of a plurality of the motor lead wires 7 are, as shown in FIG. 3(c), juxtaposed in the "X" direction and in a state of the flat cable 70 in an obliquely inclined state in the "Z" direction. Therefore, a region occupied by a plurality of the motor lead wires 7 in the "X" direction is narrow and thus, even in a case that the third portions 73 and the drive gear 68 are overlapped with each other when viewed in the "X" direction, the motor lead wires 7 and the drive gear 68 are hard to be contacted with each other.

In order to attain the structure, in this embodiment, as shown in FIG. 5, an inner face of the side plate part 321 of the case 3 is formed with a first projection 36 in a plate shape provided with a lead wire receiving part 361 which is obliquely inclined from the "X" direction to the "Z" direction in the motor lead wire passage 30. The third portions 73 (flat cable 70) of a plurality of the motor lead wires 7 are supported in an obliquely inclined state in the "Z" direction along the lead wire receiving part 361 (see FIG. 3(c)). Further, an inner face of the side plate part 321 of the case 3 is formed with a second projection 37 in a plate shape provided with a lead wire receiving part 371 which is obliquely inclined from the "X" direction to the "Z" direction in the motor lead wire passage 30 at a position separated from the first projection 36 on one side "Y1" in the "Y" direction. The third portions 73 (flat cable 70) of a plurality of the motor lead wires 7 are supported in an obliquely inclined state in the "Z" direction along the lead wire receiving part 371 (see FIG. 3(c)).

(Connecting Structure of Motor Lead Wire 7 with Motor 61)

In this embodiment, a plurality of the motor lead wires 7 has the same length as each other. The motor lead wire 7 is structured of a core wire having conductivity which is coated by a film made of insulating material and films of adjacent motor lead wires 7 are fusion-bonded to structure the flat cable 70. A plurality of the motor lead wires 7 is respectively shown by the reference signs 7A, 7B, 7C and 7D (see FIGS. 3(a) and 3(b)). The motor lead wires 7A, 7B, 7C and 7D are separated from each other in the first portions 71 extended from the connecting positions 79 with the motor 61 and in the connected portions of the first portions 71 with the second portions 72.

Figure 6:
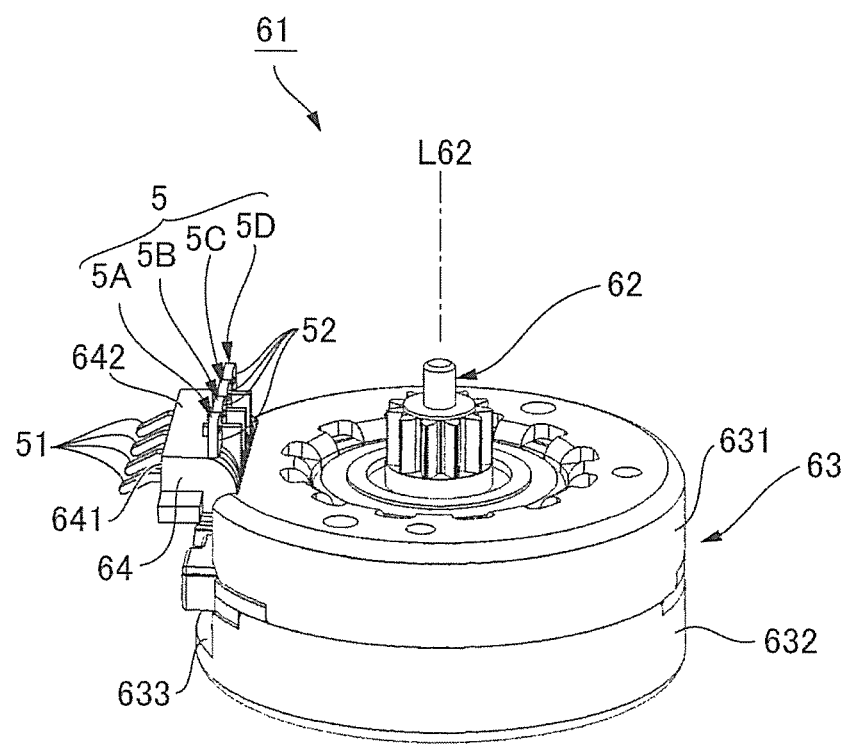
FIG. 6 is a perspective outward appearance view showing a motor.

FIG. 6 is a perspective outward appearance view showing the motor 61. The motor 61 includes a rotor 62 provided with a permanent magnet on an outer peripheral side of a rotation shaft and a tube shaped stator 63 which surrounds an outer peripheral side of the rotor 62. The motor 61 is disposed in the drive chamber 60 in a state that a turning center axial line "L62" of the rotor 62 is directed in the "X" direction. The stator 63 includes a pair of outer stator cores 631 and 632 in a bottomed tube shape which are also served as a motor case. The stator 63 is formed with an opening part 633 which is formed by cutting out side faces of the outer stator cores 631 and 632 on the other side "Z2" in the "Z" direction, and a terminal block 64 is provided in the opening part 633. The terminal block 64 holds a plurality of terminal pins 5. The number of arranged terminal pins 5 corresponds to the number of the motor lead wires 7. A plurality of the terminal pins 5 is respectively shown by the reference signs 5A, 5B, 5C and 5D. The terminal pins 5A, 5B, 5C and 5D are arranged in a line in this order from one side "Y1" in the "Y" direction toward the other side "Y2".

The terminal block 64 is extended in the "Y" direction and is provided with a first face 641 which faces the other side "Z2" in the "Z" direction and a second face 642 which faces one side "X1" in the "X" direction. First terminal parts 51 which are one end parts of the terminal pins 5A, 5B, 5C and 5D are protruded from the first face 641 of the terminal block 64 side by side in a line in the "Y" direction. Further, second terminal parts 52 which are the other end parts of the terminal pins 5A, 5B, 5C and 5D are protruded from the second face 642 of the terminal block 64 side by side in a line in the "Y" direction. The first terminal parts 51 are portions around which lead-out wires of coils provided in the stator 63 are bound and connected, and the second terminal parts 52 are portions with which core wires of the motor lead wires 7A, 7B, 7C and 7D are connected by soldering or the like.

As shown in FIG. 3(a), the first portions 71 of the motor lead wires 7 (7A, 7B, 7C and 7D) are respectively extended in the "Z" direction in a state that the motor lead wires 7A, 7B, 7C and 7D are separated from each other and, in addition, these four wires are juxtaposed in this order from one side "Y1" to the other side "Y2" in the "Y" direction. At the connecting positions 79, the motor lead wire 7A is connected with the terminal pin 5A, the motor lead wire 7B is connected with the terminal pin 5B, the motor lead wire 7C is connected with the terminal pin 5C, and the motor lead wire 7D is connected with the terminal pin 5D.

In the second portions 72, the four motor lead wires 7A, 7B, 7C and 7D are bent from a state juxtaposed in the "Y" direction to a state juxtaposed in the "X" direction. Further, in the third portions 73, as described above, the four motor lead wires 7A, 7B, 7C and 7D are juxtaposed in this order from one side "X1" in the "X" direction to the other side "X2" to structure the flat cable 70 and are extended in the "Y" direction. The fourth portions 74 are bent from the state that the four motor lead wires 7A, 7B, 7C and 7D are juxtaposed in the "X" direction to a reverse arrangement state to the first portions 71, in other words, to a state that the motor lead wires 7D, 7C, 7B and 7A are juxtaposed from one side "Y1" in the "Y" direction toward the other side "Y2" in this order. In the fifth portions 75, the motor lead wires 7D, 7C, 7B and 7A are extended in the "Z" direction toward the cut-out part 329 of the case 3 in a state juxtaposed in the "Y" direction.

In this embodiment, work for incorporating the motor lead wires 7 in the motor lead wire passage 30 is, for example, performed as follows. First, before incorporating the motor 61 in the drive chamber 60, the motor lead wires 7 (7A, 7B, 7C and 7D) and the second terminal parts 52 of the terminal pins 5 (5A, 5B, 5C and 5D) are connected with each other by soldering or the like and, after that, the motor 61 is incorporated in the drive chamber 60. After that, while successively bending a plurality of the motor lead wires 7 (7A, 7B, 7C and 7D) connected with the terminal pins 5 (5A, 5B, 5C and 5D) so as to structure the first portions 71, the second portions 72, the third portions 73, the fourth portions 74 and the fifth portions 75, the plurality of the motor lead wires 7 are successively incorporated in the case 3 from the other side "Y2" toward one side "Y1" in the "Y" direction.

Principal Effects in this Embodiment

As described above, in the damper device 1 and the geared motor 10 in this embodiment, the case 3 is provided with the motor lead wire passage 30 which is extended in the "Y" direction so as to pass a position interposed in the "Z" direction between the turning center axial line "L68" of the drive gear 68 included in the gear train 65 and the side plate part 321 of the case body part 32. Therefore, a plurality of the motor lead wires 7 can be extended in the "Y" direction in a state that the positions in the "Z" direction of the motor lead wires 7 are restricted. Further, the plurality of the motor lead wires 7 is extended in the motor lead wire passage 30 from the other side "Y2" to one side "Y1" in the "Y" direction in a state that at least parts of the motor lead wires 7 are bent to a side of the bottom plate part 31 with respect to the connecting positions 79 with the motor 61, and this state is maintained by firmness (shape retaining force) of the motor lead wire 7 itself. Therefore, the motor lead wires can be led around to a position separated in the "Y" direction from the motor 61 in a state that the motor lead wires 7 and the gear train 65 are not contacted with each other. Accordingly, flexibility for a power feeding position to the motor can be enhanced.

The motor lead wire passage 30 is formed in a slit shape which opens toward one side "X1" in the "X" direction and thus the motor lead wires 7 can be put in the motor lead wire passage 30 from one side "X1" in the "X" direction. Therefore, the motor lead wires 7 are easily led around.

The motor lead wire passage 30 is structured by the bottom plate part 31 on the other side "X2" in the "X" direction. Therefore, parts of the motor lead wires 7 can be bent to a position contacting with the bottom plate part 31 or a position close to the bottom plate part 31. Therefore, when viewed in the "X" direction, even in a case that a plurality of the motor lead wires 7 and the drive gear 68 are overlapped with each other, the motor lead wires 7 and the drive gear 68 are hard to be contacted with each other.

Parts of a plurality of the motor lead wires 7 are, when viewed in the "X" direction, overlapped with the drive gear 68 on the other side "X2" in the "X" direction in the motor lead wire passage 30 and thus a dimension in the "Z" direction of the geared motor 10 can be reduced.

The third portions 73 of the motor lead wires 7 which are bent toward the other side "X2" in the "X" direction are overlapped with the drive gear 68 in the "X" direction and thus the motor lead wires 7 and the drive gear 68 are hard to be contacted with each other. Further, the third portions 73 of the motor lead wires 7 are prevented from displacing to one side "X1" in the "X" direction by the cover side projection 28 formed in the cover 20 and thus the motor lead wires 7 and the drive gear 68 are hard to be contacted with each other.

The third portions 73 of the motor lead wires 7 are juxtaposed in the "X" direction in the motor lead wire passage 30 and thus a region occupied by the third portions 73 of the motor lead wires 7 is narrow in the "Z" direction. Therefore, even when the third portions 73 of the motor lead wires 7 are disposed at a position near the turning center axial line "L68" of the drive gear 68, the motor lead wires 7 and the drive gear 68 are hard to be contacted with each other.

The motor 61 is held by the case 3 and the gear train 65 is turnably supported by the bottom plate part 31 of the case 3. Therefore, when the motor 61 and the gear train 65 are incorporated in the case 3 and then the cover 20 is fitted, assembling work can be easily performed. Further, the cover 20 is integrally structured with the frame 2 and thus, in comparison with a case that the cover 20 is separately structured from the frame 2, assembling efficiency is improved and the number of components can be reduced.

(Modified Embodiment of Leading-Around Structure of Motor Lead Wire 7)

In the embodiment described above, a plurality of the motor lead wires 7 (7A, 7B, 7C and 7D) is extended in the "Y" direction in a state juxtaposed in the "X" direction in the motor lead wire passage 30. However, as shown in FIG. 3(a), a plurality of the terminal pins 5 (5A, 5B, 5C and 5D) with which the motor lead wires 7A, 7B, 7C and 7D are connected is disposed in a line in the "Y" direction and distances of the respective terminal pins from an outlet 30*a* of the motor lead wire passage 30 are different from each other. In this case, the outlet 30*a* of the motor lead wire passage 30 is the outlet 30*a* going toward the other side "Y2" in the "Y" direction from the motor lead wire passage 30 and is provided at a position between an end part on the other side "Y2" in the "Y" direction of the second plate-shaped projection 352 by which the motor lead wire passage 30 is sectioned and the side plate part 321.

In a modified embodiment, a plurality of motor lead wires 17 (hereinafter, shown by the reference signs 17A, 17B, 17C and 17D) having lengths different from the above-mentioned embodiment is used. Further, a bending tendency giving process in which the motor lead wires 17 (17A, 17B, 17C and 17D) are previously formed in a shape of a wiring space within the case 3 is performed. Next, the same reference signs are used in the same portions as the embodiment described above and their descriptions are omitted and different portions will be described below by using different reference signs.

Figure 7A:
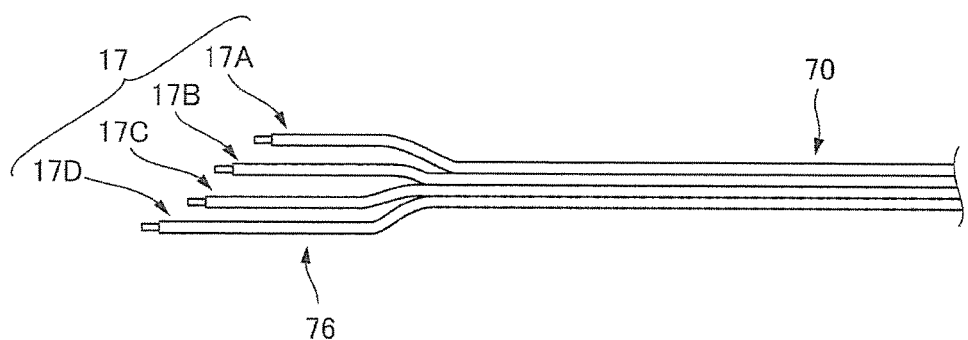
FIGS. 7(a), 7(b) and 7(c) are explanatory views schematically showing motor lead wires in a modified embodiment.
Figure 7B:
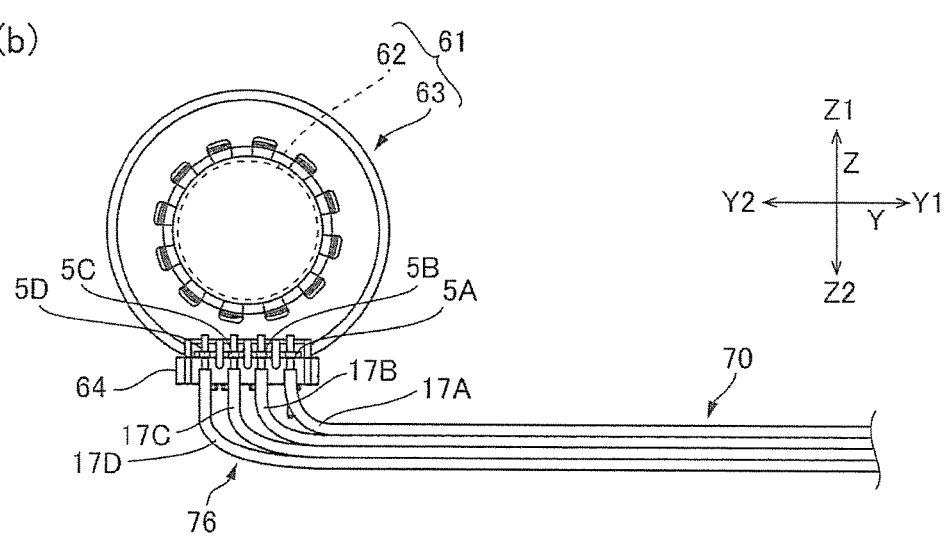

FIGS. 7(*a*), 7(*b*) and 7(*c*) are explanatory views schematically showing motor lead wires 17 in a modified embodiment. FIG. 7(*a*) shows a state that the motor lead wires 17 are not connected with the motor 61, FIG. 7(*b*) shows a state that the motor lead wires 17 are connected with the motor 61, and FIG. 7(*c*) shows a state that a bending tendency giving process has been performed on the motor lead wires 17. As shown in FIG. 7(*b*) and FIG. 7(*c*), in the modified embodiment, a plurality of motor lead wires 17A, 17B, 17C and 17D whose lengths are different from each other are connected with the motor 61. The motor lead wires 17A, 17B, 17C and 17D are, similarly to the embodiment described above, provided with a portion structuring a flat cable 70 and a portion (separated part 76) separated into respective wires.

As shown in FIG. 7(*a*), a plurality of the motor lead wires 17A, 17B, 17C and 17D are juxtaposed to each other in this order. The separated part 76 is structured so that lengths of the motor lead wires 17A, 17B, 17C and 17D from a portion connected with the flat cable 70 to their tip ends are set longer in the order of the motor lead wires 17A, 17B, 17C and 17D. When the separated part 76 is extended toward the motor 61 side, the tip end parts of the motor lead wires 17A, 17B, 17C and 17D are arranged in this order from one side "Y1" to the other side "Y2" in the "Y" direction. In other words, the tip end parts of the motor lead wires 17A, 17B, 17C and 17D are disposed in the same order as the terminal pins 5A, 5B, 5C and 5D on the other side "Z2" in the "Z" direction of the terminal block 64.

In the modified embodiment, the terminal pins 5A, 5B, 5C and 5D provided in the motor 61 are sequentially connected with the motor lead wires 17A, 17B, 17C and 17D in the shorter order of the length and in the nearer order from the outlet 30*a* of the motor lead wire passage 30 (in the order of the terminal pins 5A, 5B, 5C and 5D). As a result, in a state that the motor 61 is incorporated in the case 3, a plurality of the terminal pins 5A, 5B, 5C and 5D are connected with the motor lead wires 17 having shorter lengths as they are nearer to the outlet 30*a* of the motor lead wire passage 30.

The motor lead wires 17A, 17B, 17C and 17D are juxtaposed in this order from the opening part of the motor lead wire passage 30 toward the bottom part (from one side "X1" toward the other side "X2" in the "X" direction) when incorporated in the motor lead wire passage 30. Therefore, the motor lead wires 17A, 17B, 17C and 17D are overlapped with each other from one side "X1" to the other side "X2" in the "X" direction in the shorter order of the length at the outlet 30*a* of the motor lead wire passage 30. Accordingly, a plurality of the terminal pins 5A, 5B, 5C and 5D is sequentially connected with the motor lead wires 17A, 17B, 17C and 17D in the nearer order from the outlet 30*a* of the motor lead wire passage 30 (in the order of the terminal pins 5A, 5B, 5C and 5D) and in the order of the position located on one side "X1" in the "X" direction.

In the modified embodiment, as described above, the lengths of the motor lead wires 17A, 17B, 17C and 17D are different from each other and thus, when their end parts are respectively connected with the terminal pins 5A, 5B, 5C and 5D, the separated part 76 is curved in a shape shown in FIG. 7(*b*) as a whole. In other words, the separated part 76 is deformed in a shape bent to one side "Z1" in the "Z" direction as a whole by performing connecting work with the terminal pins 5A, 5B, 5C and 5D without forcibly bending the separated part 76 to one side "Z1" in the "Z" direction after connection. This shape is a shape corresponding to a shape of the wiring space where the first portions 71 and the second portions 72 are disposed. Therefore, connecting work of the motor lead wires 17A, 17B, 17C and 17D with the motor 61 is easily performed, and incorporating to the motor lead wire passage 30 and incorporating to the wiring space from the motor lead wire passage 30 toward the drive chamber 60 side are also easily performed. Accordingly, a working hour for wiring work can be shortened. In accordance with an embodiment of the present invention, it may be structured that tip end parts of the motor lead wires 17A, 17B, 17C and 17D are previously bent and all of four wires are arranged in shapes bent to one side "Z1" in the "Z" direction and, after that, the tip end parts of the motor lead wires 17A, 17B, 17C and 17D are connected with the terminal pins 5A, 5B, 5C and 5D.

The motor lead wires 17A, 17B, 17C and 17D are connected with a plurality of the terminal pins 5A, 5B, 5C and 5D so that a motor lead wire having a shorter length and located on the opening part side (one side "X1" in the "X" direction) in the motor lead wire passage 30 is connected with the terminal pin nearer to the outlet 30*a* of the motor lead wire passage 30. Therefore, in the first portions 71 and the second portions 72, it can be avoided that lengths of the motor lead wires 17A, 17B, 17C and 17D become needlessly longer and that margin of the length is insufficient. For example, excessive slack of the motor lead wire 17A connected with the terminal pin 5A which is the nearest to the outlet 30*a* can be avoided. Further, the motor lead wire 17D connected with the terminal pin 5D on the farthest side from the outlet 30*a* can be avoided from being pulled at the time of being incorporated. Further, a longer motor lead wire is led around from the bottom part side of the motor lead wire passage 30 to a far side and a shorter motor lead wire is led around from the opening part side of the motor lead wire passage 30 to a near side and thus the motor lead wires 17A, 17B, 17C and 17D can be orderly led around. Also from this point, incorporating of the motor lead wires 17A, 17B, 17C and 17D to the motor lead wire passage 30 and incorporating to the wiring space from the motor lead wire passage 30 toward the drive chamber 60 side are easily performed. Therefore, a working hour for wiring work can be shortened.

Figure 7C:
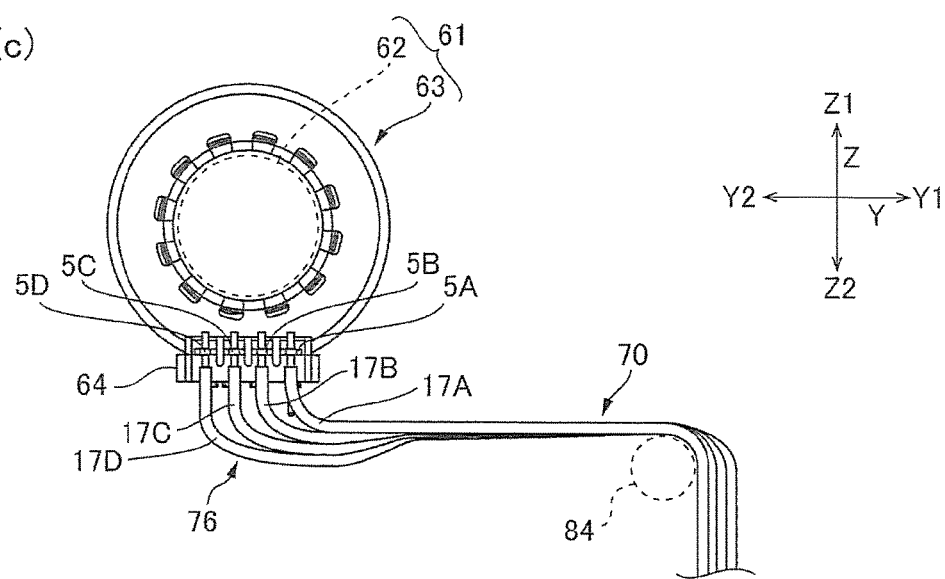

As shown in FIG. 7(*c*), in the modified embodiment, after a plurality of the motor lead wires 17A, 17B, 17C and 17D whose lengths are different from each other is connected with the motor 61, a bending tendency in a shape bent to the other side "Z2" in the "Z" direction so as to correspond to the shape of the wiring space of the case 3 is given to connecting portions of the fourth portions 74 with the fifth portions 75 of the motor lead wires 17A, 17B, 17C and 17D in the embodiment described above. For example, the motor lead wires 17A, 17B, 17C and 17D are wound around a bending tendency giving member 84 in a bar shape as shown by the broken line in FIG. 7(c). Next, coating films coated on the core wires of the motor lead wires 17A, 17B, 17C and 17D are pressed against an outer peripheral face of the bending tendency giving member 84 and the coating films are deformed in a shape corresponding to its outer peripheral face. In this manner, as shown in FIG. 7(c), the motor lead wires 17A, 17B, 17C and 17D are given with a bending tendency in a bent shape. In this case, a jig used for giving a bending tendency is not limited to a bar shape and another shape around which the motor lead wires 17A, 17B, 17C and 17D are capable of being wound in a bent shape may be adopted.

As described above, when the motor lead wires 17A, 17B, 17C and 17D are previously given with a bending tendency in a shape of the wiring space in the case 3, in a case that the bent portions are to be incorporated to the wiring space, bending work in the shape of the wiring space is not required and it is sufficient that the bent portions are fitted to the wiring space. Therefore, workability of wiring work is improved and a working hour can be shortened.

FIGS. 8(a), 8(b) and 8(c) are explanatory views showing an example of a jig which is used for connecting work of the motor lead wires 17A, 17B, 17C and 17D and the motor 61. FIG. 8(a) is a front view, FIG. 8(b) is a side view, and FIG. 8(c) shows a working condition. In the modified embodiment, a stator 63 to which a rotor 62 is not assembled is attached to a jig 80, motor lead wires 17A, 17B, 17C and 17D are connected with terminal pins 5A, 5B, 5C and 5D of the stator 63 in advance before assembled into the case 3.

The jig 80 is provided with a pedestal part 82 which is placed on a workbench 90, a vertical plate part 81 standing up toward an upper side from the pedestal part 82, and a stator mounting part 83 in a columnar shape which is protruded from a surface of the vertical plate part 81. As shown in FIG. 8(c), the stator 63 is attached to the stator mounting part 83 in a posture that the terminal block 64 is located on a lower side. In this state, the motor lead wires 17A, 17B, 17C and 17D are extended to a lower side of the stator mounting part 83 and the separated part 76 is disposed to a lower side of the terminal block 64. Then, one end parts of the motor lead wires 17A, 17B, 17C and 17D are lifted one by one to an upper side and connected with the terminal pins 5A, 5B, 5C and 5D by soldering or the like.

When a bending tendency giving member 84 in a bar shape is provided next to the stator mounting part 83 as shown by the broken line in FIG. 8(c), it can be also structured that the motor lead wires 17A, 17B, 17C and 17D are led around from a lower side of the stator 63 to a side of the bending tendency giving member 84 to perform bending tendency giving work. In this case, it is desirable that a positional relationship between the bending tendency giving member 84 and the stator mounting part 83 is set so as to correspond to a positional relationship between the motor 61 and the bent portions (connected portions of the fourth portions 74 with the fifth portions 75) of the motor lead wires 17A, 17B, 17C and 17D when assembled in the case 3.

In the modified embodiment, work for incorporating a plurality of the motor lead wires 17 to the motor lead wire passage 30 is, for example, performed as follows. First, motor lead wires 17A, 17B, 17C and 17D are connected with a stator 63 by using the above-mentioned jig 80 before a rotor 62 is incorporated (first process). Next, portions which structure the fourth portions 74 and the fifth portions 75 of the motor lead wires 17A, 17B, 17C and 17D are given with a bending tendency in a shape bent by a bending tendency giving member 84 in advance (second process). Next, the rotor 62 and the stator 63 are assembled to structure a motor 61 and then the motor 61 is assembled to a drive chamber 60 of a case 3 (third process). After that, the motor lead wires 17A, 17B, 17C and 17D which are connected with the terminal pins 5A, 5B, 5C and 5D of the motor 61 and are given with a bending tendency are incorporated to a wiring space in the case 3 (fourth process).

Required times for wiring work and the like were measured in a case that the motor lead wires 7A, 7B, 7C and 7D in the embodiment described above are used and a case that the motor lead wires 17A, 17B, 17C and 17D in the modified embodiment are used. As a result, a total required time of work for incorporating the motor 61 to the drive chamber 60 of the case 3 and work for incorporating the motor lead wires 7A, 7B, 7C and 7D/17A, 17B, 17C and 17D which are connected with the motor 61 to the wiring space in the case 3 including the motor lead wire passage 30 and leading out from the cut-out part 329 to the outside of the case 3 (in other words, a required time of the third process and the fourth process) was 16.63 seconds in a case of the motor lead wires 7A, 7B, 7C and 7D in the embodiment described above (lengths are the same and a bending tendency is not given) and was 10.03 seconds in a case of the motor lead wires 17A, 17B, 17C and 17D in the modified embodiment (lengths are different and a bending tendency is given). Therefore, in the modified embodiment, it was confirmed that a working hour of the wiring work can be shortened.

In the modified embodiment, all of the lengths of a plurality of the motor lead wires 17A, 17B, 17C and 17D are different from each other but lengths of some of a plurality of the motor lead wires may be different from others. For example, lengths of adjacent two or three motor lead wires may be set the same as each other. Even in this structure, some of a plurality of the terminal pins 5A, 5B, 5C and 5D can be connected with motor lead wires whose length is shorter as nearer to the outlet 30a of the motor lead wire passage 30. Therefore, some of a plurality of the motor lead wires 17A, 17B, 17C and 17D are avoided from occurring excessive slack and from being pulled due to insufficient margin of the length. Further, the number of the motor lead wires is not limited to four but the present invention may be applied to a structure that motor lead wires having another number are led around.

Other Embodiments

Although the present invention has been shown and described with reference to a specific embodiment, various changes and modifications will be apparent to those skilled in the art from the teachings herein. For example, the present invention may be applied to a case that the cover 20 is separately structured from the frame 2. Further, the damper device 1 in the embodiment described above is for a refrigerator but the present invention is not limited to a damper device used for a refrigerator.

What is claimed is:
1. A geared motor, wherein directions perpendicular to each other are referred to as an "X" direction and a "Y" direction, and a direction perpendicular to the "X" direction and the "Y" direction is referred to as a "Z" direction, the geared motor comprising:
a case, which is a bottomed case, comprising a case body part which opens toward one side in the "X" direction, and a bottom plate part located on the other side in the "X" direction with respect to the case body part;
a cover which covers an opening of the case body part of the case on the one side in the "X" direction;
a motor which is disposed inside the case;
a plurality of motor lead wires having flexibility which are connected with the motor; and
a gear train disposed in the case on one side in the "Y" direction with respect to the motor in a manner that turning center axial lines of gears included in the gear train are directed in the "X" direction;
wherein the case comprises a motor lead wire passage whose depth direction is the "X" direction and which is extended in the "Y" direction so as to pass a position interposed in the "Z" direction between the turning center axial lines of the gears included in the gear train and the case body part; and
wherein the plurality of the motor lead wires are extended from the other side to the one side in the "Y" direction through the motor lead wire passage in a state that at least parts of the plurality of the motor lead wires are bent in the motor lead wire passage from a connecting position of the motor lead wires and the motor so as to be located on a side of the bottom plate part,
wherein parts of the plurality of the motor lead wires are overlapped with one of the gears on the other side in the "X" direction in the motor lead wire passage when viewed in the "X" direction,
wherein each of the motor lead wires comprises:
a first portion which is extended from the connecting position;
a second portion which is bent from an end part of the first portion to the other side in the "X" direction and is extended in the motor lead wire passage;
a third portion which is bent from an end part on the other side in the "X" direction of the second portion to the one side in the "Y" direction and is extended in the motor lead wire passage;
a fourth portion which is bent from an end part on the one side in the "Y" direction of the third portion to the one side in the "X" direction and is extended in the motor lead wire passage; and
a fifth portion which is extended from an end part on the one side in the "X" direction of the fourth portion, and
at least a part of the third portion is overlapped with the one of the gears on the other side in the "X" direction when viewed in the "X" direction.

2. The geared motor according to claim 1, wherein the motor lead wire passage is formed in a slit shape which opens toward the one side in the "X" direction.

3. The geared motor according to claim 1, wherein the motor lead wire passage is structured by the bottom plate part on the other side in the "X" direction.

4. The geared motor according to claim 1, wherein the fifth portion is extended in the "Z" direction and held by the case.

5. The geared motor according to claim 4, wherein the cover is provided with a cover side projection at a position displaced from the gears in the "Y" direction so as to protrude toward the other side in the "X" direction to prevent displacement of the third portion to the one side in the "X" direction.

6. The geared motor according to claim 1, wherein the plurality of the motor lead wires is juxtaposed in the "X" direction and extended in the "Y" direction in the motor lead wire passage.

7. The geared motor according to claim 6, wherein
the case is provided with a lead wire receiving part which is obliquely inclined from the "X" direction to the "Z" direction in the motor lead wire passage, and
the plurality of the motor lead wires are juxtaposed in the "X" direction in an obliquely inclined state in the "Z" direction along the lead wire receiving part.

8. The geared motor according to claim 7, wherein the plurality of the motor lead wires is formed in a flat cable in which the plurality of the motor lead wires are connected with each other in a juxtaposed state in the "X" direction in the motor lead wire passage.

9. The geared motor according to claim 1, wherein the case body part is formed in a rectangular shape whose long side is extended in the "Y" direction when viewed in the "X" direction.

10. The geared motor according to claim 1, wherein
the motor is held by the case, and
the gear train is turnably supported by the bottom plate part of the case.

11. A manufacturing method for a geared motor according to claim 1, wherein directions perpendicular to each other are referred to as an "X" direction and a "Y" direction, and a direction perpendicular to the "X" direction and the "Y" direction is referred to as a "Z" direction, the geared motor comprising:
the manufacturing method comprising:
a bending tendency giving process in which the plurality of the motor lead wires are given with a bending tendency in a bent shape; and
an assembling process in which the plurality of the motor lead wires which have been given with the bending tendency is assembled in the case.

12. The geared motor according to claim 1, wherein
the gear train comprises a drive gear having a large diameter gear driven by the motor and an output gear engaged with the drive gear and driven by the drive gear,
the motor is disposed on the other side in the "Y" direction and the output gear is disposed on the one side in the "Y" direction,
the third portion of each of the plurality of the motor lead wires is overlapped with the large diameter gear of the drive gear on the other side in the "X" direction, and
the cover is provided with a cover side projection which is protruded toward the other side in the "X" direction at a position on the other side in the "Y" direction with respect to the large diameter gear of the drive gear to prevent displacement to the one side in the "X" direction of the third portion.

13. The geared motor according to claim 1, wherein
the cover comprises a lead wire support part structured to support midway portions of the motor lead wires from an outer face side between an outer face of the case body part and the lead wire support part at a position on the one side in the "Y" direction,
the fifth portion of each of the motor lead wires is supported by an end part on the one side in the "X" direction of the case body part, and
the motor lead wires are extended to the other side in the "X" direction between the outer face of the case body part and the lead wire support part of the cover to lead out to an outside of the case body part.

14. The geared motor according to claim 13, wherein a distance between the outer face of the case body part and the lead wire support part of the cover is larger than a diameter of each of the motor lead wires.

15. A geared motor, wherein directions perpendicular to each other are referred to as an "X" direction and a "Y" direction, and a direction perpendicular to the "X" direction and the "Y" direction is referred to as a "Z" direction, the geared motor comprising:
- a case, which is a bottomed case, comprising a case body part which opens toward one side in the "X" direction, and a bottom plate part located on the other side in the "X" direction with respect to the case body part;
- a cover which covers an opening of the case body part of the case on the one side in the "X" direction;
- a motor which is disposed inside the case;
- a plurality of motor lead wires having flexibility which are connected with the motor; and
- a gear train disposed in the case on one side in the "Y" direction with respect to the motor in a manner that turning center axial lines of gears included in the gear train are directed in the "X" direction;
- wherein the case comprises a motor lead wire passage whose depth direction is the "X" direction and which is extended in the "Y" direction so as to pass a position interposed in the "Z" direction between the turning center axial lines of the gears included in the gear train and the case body part; and
- wherein the plurality of the motor lead wires are extended from the other side to the one side in the "Y" direction through the motor lead wire passage in a state that at least parts of the plurality of the motor lead wires are bent in the motor lead wire passage from a connecting position of the motor lead wires and the motor so as to be located on a side of the bottom plate part,
- wherein lengths of part or all of the plurality of the motor lead wires are different from each other,
- the motor comprises a plurality of terminals whose distances from an outlet of the motor lead wire passage are different from each other, and
- part or all of the plurality of the terminals are connected with the motor lead wires having shorter lengths as located nearer to the outlet of the motor lead wire passage.

16. The geared motor according to claim 15, wherein the plurality of the motor lead wires is located in the motor lead wire passage closer to the one side in the "X" direction as the terminal connected with the motor lead wires is nearer to the outlet of the motor lead wire passage.

17. A damper device comprising a geared motor, wherein directions perpendicular to each other are referred to as an "X" direction and a "Y" direction, and a direction perpendicular to the "X" direction and the "Y" direction is referred to as a "Z" direction, the geared motor comprising:
- a case, which is a bottomed case, comprising a case body part which opens toward one side in the "X" direction, and a bottom plate part located on the other side in the "X" direction with respect to the case body part;
- a cover which covers an opening of the case body part of the case on the one side in the "X" direction;
- a motor which is disposed inside the case;
- a plurality of motor lead wires having flexibility which are connected with the motor; and
- a gear train disposed in the case on one side in the "Y" direction with respect to the motor in a manner that turning center axial lines of gears included in the gear train are directed in the "X" direction;
- wherein the case comprises a motor lead wire passage whose depth direction is the "X" direction and which is extended in the "Y" direction so as to pass a position interposed in the "Z" direction between the turning center axial lines of the gear included in the gear train and the case body part; and
- wherein the plurality of the motor lead wires are extended from the other side to the one side in the "Y" direction through the motor lead wire passage in a state that at least parts of the plurality of the motor lead wires are bent in the motor lead wire passage from a connecting position of the motor lead wires and the motor so as to be located on a side of the bottom plate part,
- the damper device comprising:
- a frame which is provided on the one side in the "X" direction with respect to the case and is formed with an opening part which is capable of opening in the "Z" direction; and
- a baffle configured to open and close the opening part,
- wherein the baffle is driven by the geared motor,
- the damper device further comprising:
- a heater which is fixed to the frame around the opening part; and
- a heater lead wire having flexibility which is electrically connected with the heater,
- wherein the heater lead wire is extended to the other side in the "X" direction of the cover through a heater lead wire passage formed in the cover and is led out from the case to an outer side together with the plurality of the motor lead wires, and
- wherein at least one of the cover and the case is provided with a lead wire support part structured to support a midway portion of the heater lead wire from an outer side.

18. The damper device according to claim 17, wherein the cover is integrally structured with the frame.

19. The damper device according to claim 17, wherein the cover is provided with a cover side lead wire support part as the lead wire support part structured to support midway portions of the plurality of the motor lead wires and the heater lead wire from the outer side between an outer face of the case and the cover side lead wire support part.

* * * * *